United States Patent [19]

Inoue et al.

[11] Patent Number: 5,378,645
[45] Date of Patent: Jan. 3, 1995

[54] METHOD OF MAKING A SEMICONDUCTOR DEVICE WITH A CAPACITOR

[75] Inventors: Nobuhiko Inoue; Masaki Yoshimaru, both of Tokyo, Japan

[73] Assignee: Oki Electric Industry Co., Ltd., Tokyo, Japan

[21] Appl. No.: 62,752

[22] Filed: May 18, 1993

[30] Foreign Application Priority Data

May 21, 1992 [JP] Japan .................. 4-129042

[51] Int. Cl.⁶ .............................................. H01L 21/70
[52] U.S. Cl. ........................................ 437/47; 437/52; 437/60; 437/238; 437/919
[58] Field of Search ............... 437/47, 52, 60, 235, 437/238, 919; 257/310

[56] References Cited

U.S. PATENT DOCUMENTS

| | | | |
|---|---|---|---|
| 4,438,157 | 3/1984 | Romano-Moran | 437/238 |
| 5,032,545 | 7/1991 | Doan et al. | 437/242 |
| 5,104,819 | 4/1992 | Freiberger et al. | 437/978 |

FOREIGN PATENT DOCUMENTS

| | | | |
|---|---|---|---|
| 0298758 | 12/1989 | Japan | 437/919 |
| 03-8367 | 1/1991 | Japan | 257/310 |
| 0014232 | 1/1991 | Japan | 437/919 |

*Primary Examiner*—Tom Thomas
*Attorney, Agent, or Firm*—Steven M. Rabin

[57] ABSTRACT

A method of manufacturing a semiconductor device having a capacitor comprises the steps of forming a silicon oxide layer on a semiconductor substrate, forming a first silicon nitride layer on the silicon oxide layer, forming a polycrystalline silicon layer as a lower electrode layer of the capacitor on the first silicon nitride layer, subjecting the polycrystalline silicon layer to the natural outside atmosphere so as to form a native oxide layer on the polycrystalline silicon layer, removing the native oxide layer to expose the polycrystalline silicon layer to an inactive gas atmosphere, Forming a second silicon nitride layer on the exposed polycrystalline silicon layer subjecting the second silicon nitride layer to the outside atmosphere so as to form a capacitor oxide layer on the polycrystalline silicon layer, the second silicon nitride layer and the capacitor oxide layer working as a dielectric layer of the capacitor, and forming an upper electrode layer of the capacitor on the capacitor oxide layer.

18 Claims, 1 Drawing Sheet

METHOD OF MAKING A SEMICONDUCTOR DEVICE WITH A CAPACITOR

CROSS REFERENCE TO RELATED APPLICATION

This application claims the priority of Japanese Application Serial No. 129042/1992, filed May 21, 1992, the subject matter of which is incorporated herein by reference.

BACKGROUND OF THE INVENTION

The present invention relates to a semiconductor device, particularly to the structure of the capacitor portion of a DRAM (Dynamic Random Access Memory) and the, method of manufacturing the same.

Recently the cells of DRAMs have become smaller. Particularly the dielectric film of the capacitor portion thereof is required to be thinner. For example, a technical article published in the Spring 1991 Applied Physics Society Journal 28p-V-5, "Electrical Conduction in a Very Thin Oxide-Nitride-Oxide Layered Film," authored by Kobayashi and others, discloses a technical problem in thinning the ONO (Oxide-Nitride-Oxide) film and the method of solving the same.

The technical problem disclosed in the literature is that when the nitride, i.e., the silicon nitride film is thinned, the breakdown voltage thereof is abruptly lowered. The literature teaches to thin the oxide under the nitride film, i.e., a naturally formed silicon oxide film, as a method of solving the problem. In order to apply the method disclosed in the above literature, the natural oxide (native oxide) under the silicon nitride film should be removed and the substrate should be protected from another natural oxidation. That is, it is preferable to adopt a system in which the removal of the native oxide film and the formation of the silicon nitride film can be successively performed while as the ONO film is shut off from the outside air. The system is, for example, a Load Lock Low-Pressure Chemical Vapor Deposition (referred to as an LPCVD hereinafter) device equipped with an in situ HF vapor cleaning chamber.

The inventors brought the thickness of the native oxide film near to zero as close as possible and thereafter formed the silicon nitride film using the above mentioned system. The inventors learned that when the native oxide film is thinned to an extreme degree employing this system, a silicon nitride film selectively grows on the clean surface of the silicon while it hardly grows on the silicon oxide film later. Accordingly, a polycrystalline lower electrode is oxidized at the tip end portion thereof when an oxide film is formed on the silicon nitride film, which results in a problem of lowered capacitance of capacitors. There occurred also a problem of deteriorated electric breakdown characteristic.

It is an object of the present invention to provide a method of manufacturing a semiconductor device including a capacitor which has a high capacitance.

The above object is generally achieved according to the present invention by a method of manufacturing a semiconductor device having a capacitor, which comprises the steps of forming a silicon oxide layer on a semiconductor substrate, forming a first silicon nitride layer on the silicon oxide layer, forming; a polycrystalline silicon layer as a lower electrode layer of the capacitor on the first silicon nitride layer, subjecting the polycrystalline silicon layer to the oxygen-containing outside atmosphere so as to form a native oxide layer on the polycrystalline silicon layer, removing the native oxide layer in a processing system shut off from an oxygen-containing atmosphere to expose the polycrystalline silicon layer to an inactive gas atmosphere, forming a second silicon nitride layer on the exposed polycrystalline silicon layer in the processing system, subjecting the second nitride layer to the oxygen-containing atmosphere so as to form a capacitor oxide layer on the second silicon nitride layer, the second silicon nitride layer and the capacitor oxide layer working as a dielectric layer of the capacitor, and forming an upper electrode layer of the capacitor on the capacitor oxide layer.

DESCRIPTION OF THE PREFERRED EMBODIMENT

Figure 1:
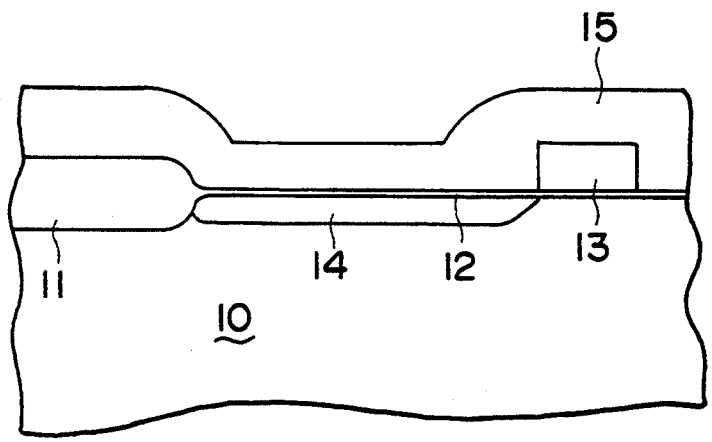
FIG. 1 is a cross-sectional view of a semiconductor device according to a preferred embodiment of the present invention in the first stage of manufacturing the same.
Figure 2:
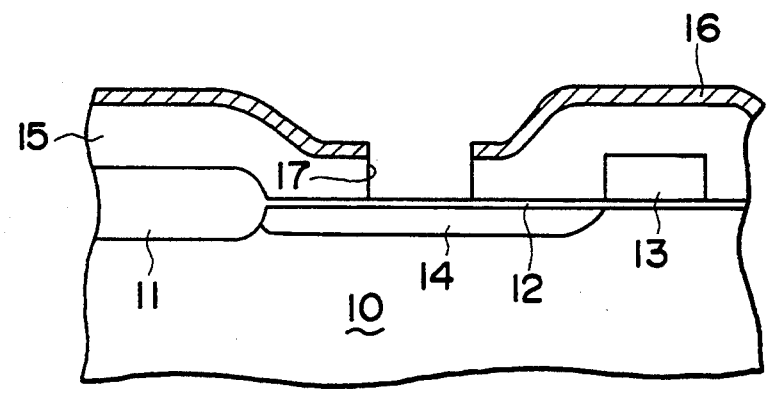
FIG. 2 is a cross-sectional view of the semiconductor device according to the preferred embodiment of the present invention in the second stage of manufacturing the same.
Figure 3:
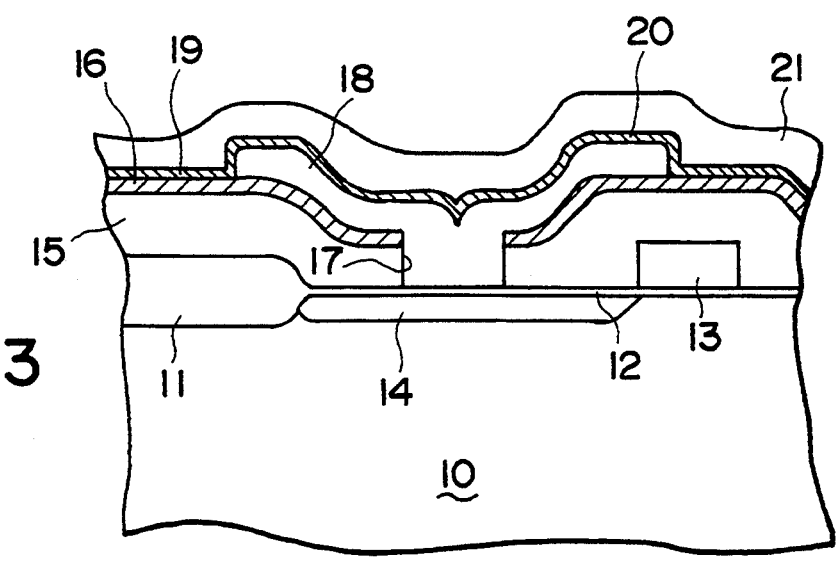
FIG. 3 is a cross-sectional view of the semiconductor device according to the preferred embodiment of the present invention in the last stage of manufacturing the same.

FIGS. 1 to 3 are cross-sectional views of the semiconductor device according to the preferred embodiment of the present invention, which will be described hereinafter in detail with reference to drawings. At first, a field oxide film 11 is formed on a silicon substrate 10 by the LOCOS (Local Oxidation of Silicon) method. The field oxide film 11 has a thickness of about 6000 Å by way of a heat treatment at 1000° C. for 100 min. in a wet oxygen atmosphere.

Then a gate oxide film 12 having a thickness of 150 to 200 Å is formed by the heat treatment, at 950 ° C for 30 min. in a dry oxygen atmosphere.

Thereafter a gate electrode 13 of a transistor is formed by the LPCVD (Low Pressure Chemical Vapor Deposition) method at a temperature of 590° to 630° C. and at a pressure of 0.1 to 0.5 Torr in a chamber which is filled with a gas of $SiH_4$ or $Si_2H_6$.

Phosphorus ions are introduced into the silicon substrate 10 at a dosage of $2 \times 10^{15}$ ions/cm$^2$ and at an accelerating voltage of 60 KeV(electron Volt) to form a diffusion layer 14.

Thereafter, an interlayer insulating film, e.g. a silicon oxide film 15 having a thickness of about 5000 Å is formed on the entire surface of the substrate 10 at a temperature of 400° C. with TEOS (Tetra-Ethoxy Silane) gas at a flow rate of 25 l/min and ozone ($O_3$)gas in the chamber in which the substrate 10 is put.

Thereafter a first silicon nitride ($Si_3N_4$) film 16 having a thickness of 1000 to 2000 Å is formed on the silicon oxide film 15 by the LPCVD method. The rate of application of the forming gases used to perform the LPCVD method are $NH_3$: 200 SCCM; $SiH_2CL_2$: 40 SCCM, the temperature is 800° C., and the pressure is 0.1 Torr. The first silicon nitride film 16 protects the lower surface and edge portion of a lower electrode 18 composed of polycrystalline silicon which is formed later to prevent the oxidation of the lower electrode 18.

Thereafter, a portion of the silicon oxide film 15 and the first silicon nitride film 16 is removed to form a contact hole 17 at the position corresponding to a diffusion layer 14. The contact hole 17 is formed at a pressure of 0.25 Torr. The rate of application of the forming gases used to perform the formation of the contact hole 17 are $CF_4$: 20 SCCM; $CHF_3$: 25 SCCM and Ar: 400 SCCM and an RF power is 80 W.

Thereafter, in an electrode forming chamber, a lower electrode 18 composed of polycrystalline silicon is formed on the first silicon nitride film 16 including the contact hole 17. The lower electrode 18 has a thickness of about 1000 Å which is formed by $SiH_4$ at a rate of 150 SCCM, at a temperature of 620° C. and at a pressure of 0.2 Torr.

Next, an in situ HF vapor cleaning is performed using a processing system which is capable of removing the native oxide film and forming a nitride film, while the substrate is shut off from the outside air, e.g., in a cluster LPCVD system or a Load Lock-LPCVD system equipped with a cleaning (oxide removing) chamber, so as to remove a native oxide film, not shown, on the surface of the lower electrode Successively, a second silicon nitride film 19 having a thickness of 30 to 200 Å is formed on the lower electrode 18 by the LPCVD method, without exposing the substrate to the outside air, at a temperature of 650° C. and at a pressure of 0.1 Torr. The flow rates of the gases using the formation of the second silicon nitride film 19 are $NH_3$: 30 SCCM; and $SiH_2Cl_2$: 30 SCCM. At that time, the second silicon nitride film 19 has a substantially uniform thickness since the first silicon nitride film 16 exists.

Thereafter the substrate 10 is taken out of (unloaded from) the aforementioned system. Therefore, the substrate 10 is subjected to an oxygen atmosphere of about 850° C. The surface of the silicon nitride film 19 is oxidized to form thermal oxide that provides a capacitor oxide film 20 having a thickness of 20 to 30 Å.

Thereafter an upper electrode 21 composed of polycrystalline silicon is formed on the silicon oxide film 20 in the same way as the lower electrode 18 so as to complete a stacked capacitor having a structure as illustrated in FIG. 3.

What is claimed is:

1. A method of manufacturing a semiconductor device having a capacitor comprising the steps:
   (a) providing a semiconductor substrate;
   (b) forming a silicon oxide layer on the semiconductor substrate;
   (c) forming a first silicon nitride layer on the silicon oxide layer;
   (d) forming a polycrystalline silicon layer as a lower electrode layer of the capacitor on the first silicon nitride layer;
   (e) forming a native oxide layer on the polycrystalline silicon layer;
   (f) without exposing the structure obtained in said step (e) to an oxygen-containing atmosphere,
      (1) removing the native oxide layer to expose the polycrystalline silicon layer, and
      (2) forming a second silicon nitride layer on the exposed polycrystalline silicon layer;
   (g) forming a capacitor oxide layer on the second silicon nitride layer in the oxygen-containing atmosphere, the second silicon nitride layer and the capacitor oxide layer working as a dielectric layer of the capacitor; and
   (h) forming an upper electrode layer of the capacitor on the capacitor oxide layer.

2. A method of manufacturing a semiconductor device according to claim 1, wherein said step of forming the first nitride layer is performed by the chemical vapor deposition method.

3. A method of manufacturing a semiconductor device according to claim 1, wherein said step of forming the second nitride layer is performed by the chemical vapor deposition method.

4. A method of manufacturing a semiconductor device according to claim 1, wherein said step of removing the native oxide layer is performed by using HF.

5. A method of manufacturing a semiconductor device according to claim 4, wherein said step of removing the native oxide layer includes subjecting the native oxide layer to an HF vapor.

6. A method according to claim 1, wherein said step of forming a capacitor oxide layer includes forming thermal oxide on the second silicon nitride layer.

7. A method of manufacturing a semiconductor device having a capacitor which includes a lower electrode, a dielectric layer and an upper electrode, the method comprising the steps:
   providing a semiconductor substrate;
   forming a silicon oxide layer on the semiconductor substrate;
   forming a first silicon nitride layer on the silicon oxide layer;
   forming a polycrystalline silicon layer as the lower electrode on the first silicon nitride layer in an electrode forming chamber;
   transferring the structure obtained by the above steps from the electrode forming chamber to an oxide removing chamber of a processing system, the processing system being shut off from an oxygen-containing atmosphere, said step of transferring including forming a native oxide layer on the polycrystalline silicon layer;
   removing the native oxide layer to expose the polycrystalline silicon layer in the oxide removing chamber;
   successively forming a second silicon nitride layer on the exposed polycrystalline silicon layer in the processing system;
   forming a capacitor oxide layer on the second silicon nitride layer in the oxygen-containing atmosphere, the second silicon nitride layer and the capacitor oxide layer providing the dielectric layer; and
   forming the upper electrode layer of the capacitor on the capacitor oxide layer.

8. A method of manufacturing a semiconductor device according to claim 7, wherein said step of forming the first nitride layer is performed by the chemical vapor deposition method.

9. A method of manufacturing a semiconductor device according to claim 7, wherein said step of forming the second nitride layer is performed by the chemical vapor deposition method.

10. A method of manufacturing a semiconductor device according to claim 7, wherein said step of removing the native oxide layer is performed by using HF.

11. A method of manufacturing a semiconductor device according to claim 10, wherein said step of removing the native oxide layer includes subjecting the native oxide layer to an HF vapor.

12. A method according to claim 7, wherein said step of forming a capacitor oxide layer includes forming thermal oxide on the second silicon nitride layer.

13. A method of manufacturing a semiconductor device having a capacitor which includes a lower electrode, a dielectric layer and an upper electrode, the method comprising the steps:

providing a semiconductor substrate;

forming a silicon oxide layer on the semiconductor substrate;

forming a first silicon nitride layer on the silicon oxide layer;

loading the structure obtained by the above steps into an electrode forming chamber;

forming a polycrystalline silicon layer as the lower electrode on the first silicon nitride layer in the electrode forming chamber;

unloading the structure obtained in the above steps from the electrode forming chamber, and forming a native oxide layer on the polycrystalline silicon layer of the unloaded Structure;

loading the structure obtained by the above steps into a processing system which is shut off from an oxygen-containing atmosphere, the processing system including an oxide removing chamber;

removing the native oxide layer to expose the polycrystalline silicon layer in the oxide removing chamber;

successively forming a second silicon nitride layer on the exposed polycrystalline silicon layer in the processing system;

unloading the structure obtained by the above steps from the processing system so that the structure is subjected to the oxygen-containing atmosphere and forming a capacitor oxide layer on the second silicon nitride layer in the oxygen-containing atmosphere; and forming the upper electrode layer of the capacitor on the capacitor oxide layer.

14. A method of manufacturing a semiconductor device according to claim 13, wherein said step, of forming the first nitride layer is performed by the chemical vapor deposition method.

15. A method of manufacturing a semiconductor device according to claim 13, wherein said step of forming the second nitride layer is performed by the chemical vapor deposition method.

16. A method of manufacturing a semiconductor device according to claim 13, wherein said step of removing the native oxide layer is performed by using HF.

17. A method of manufacturing a semiconductor device according to claim 16, wherein said step of removing the native oxide layer includes subjecting the native oxide layer to an HF vapor.

18. A method according to claim 13, wherein the step of unloading the structure from the processing system and forming a capacitor oxide layer includes forming thermal oxide on the second silicon nitride layer.

* * * * *